United States Patent

Hamilton et al.

[11] Patent Number: 5,820,697
[45] Date of Patent: Oct. 13, 1998

[54] FLUORESCENT WATER SOLUBLE SOLDER FLUX

[75] Inventors: Mark R. Hamilton, Charlotte; Marc V. Malone, Cornelius; Charles J. Merz, III, Charlotte; Joseph D. Poole, Troutman, all of N.C.

[73] Assignee: International Business Machines Corporation, Armonk, N.Y.

[21] Appl. No.: 844,079

[22] Filed: Apr. 18, 1997

[51] Int. Cl.⁶ .................................................. B23K 35/00
[52] U.S. Cl. ................. 148/23; 148/24; 148/25; 148/26; 427/310; 427/96; 428/615
[58] Field of Search ................... 148/23, 25, 24, 148/26; 427/310, 96; 428/615

[56] References Cited

U.S. PATENT DOCUMENTS 4,137,369  1/1979  Chaikin .................................... 428/624
4,670,298  6/1987  Lucas et al. ............................. 427/96
5,650,020  7/1997  Ohta et al. ............................... 148/28

FOREIGN PATENT DOCUMENTS 07075896  of 1993  Japan .
14 54 619  of 1987  U.S.S.R. .

Primary Examiner—Patrick Ryan
Assistant Examiner—M. Alexandra Elve
Attorney, Agent, or Firm—Whitham, Curtis & Whitham, Larry Fraley, Esq.

[57] ABSTRACT

A mixture of a dye including one or more water soluble fluorescent dyes and a water soluble solder flux provides simple optical inspection under ultraviolet illumination with simple apparatus. The optical inspection is thus made highly sensitive to the presence of residual water soluble flux after washing and highly specific to the water soluble flux with which the dye is mixed. Thus, optical inspection can assure that all water soluble flux is removed to avoid subsequent corrosion while providing the possibility of leaving so-called "no clean" fluxes in place.

9 Claims, 1 Drawing Sheet

FLUORESCENT WATER SOLUBLE SOLDER FLUX

BACKGROUND OF THE INVENTION

1. Field of the Invention

The present invention generally relates to soldering fluxes and, more particularly, to the fabrication, rework or repair of electronic devices, modular circuits and circuit boards and other devices including solder connections made with water soluble fluxes.

2. Description of the Prior Art

For many applications involving the joining of two or more pieces of metal to form robust electrical and mechanical connections, the formation of solder joints has been the technique of choice for many years. Soldering is especially well-suited to mounting of electrical components such as discrete elements, transistors and integrated circuit chips to circuit boards, modular packages and other substrates since very small and closely spaced connections can be made and/or reworked within relatively stringent heat budgets of the components, substrate structures or both. A flux is commonly used in conjunction with the solder to aid the flow of solder, remove oxidation on metal surfaces within the solder connection, and/or clean the surfaces of the metal substrates being joined by the solder.

In order to form such small and closely spaced connections consistent with current integrated circuit and packaging technologies, soldering techniques and materials have become highly developed and sophisticated in recent years. It is now common for fabrication and rework procedures for electronic components and other complex metal structures to involve numerous steps with slightly different solder alloys and fluxes employed during each step. Soldering conditions thus become quite critical to differentially affect the differing solder and flux materials, and complex testing and inspection procedures are necessary to assure that soldering operations have been correctly carried out.

One particularly difficult problem is presented by residual flux which may remain near a solder connection or elsewhere on the device. When it is considered that one of the functions of a flux is to remove oxidation on metal surfaces within the solder connection, it can be understood that the potential for chemical reaction or corrosion of other metal surfaces is presented by residual flux. Accordingly, for some critical applications, so-called "no clean" fluxes have been developed which do not cause corrosion and residual flux may often be left on the device. However, where residual flux must be removed as an incident of the design (e.g. because of the particular metals to be joined) or to allow rework of the device (since the presence of flux may cause undesired solder deposit or flow during such procedures), water soluble fluxes must be used to allow flux removal.

Water soluble fluxes, regardless of composition, may be more "aggressive" than "no clean" fluxes and are known to cause corrosion of most metals which are desirable for electronic component manufacture. Even though it is common to vigorously wash components following manufacturing processes with a flow of high temperature (e.g. 140° F.(60° C.)) water, residual water soluble fluxes may not be completely removed and resultant corrosion can cause failure of a component long after it is placed in service. For that reason, detection of residual flux is not susceptible to electrical testing. Chemical testing for residual flux is difficult, time-consuming, expensive and critical, yielding false-positives and failing to detect residual flux in a significant number of tests while being economically impractical to apply to more than a small sample of manufactured devices.

Inspection is also difficult in view of problems of visual access (e.g. where a component may extend over a location where residual flux may be deposited) and may be further complicated in the presence of "no clean" fluxes which are not readily distinguishable in appearance from water soluble fluxes and the fact that it may be desirable, in some cases, to leave residual "no clean" fluxes in place, for example, to prevent oxidation of the solder connection surface. Thus, upon inspection after washing, it is often assumed that any remaining flux is of the "no clean" type.

Therefore, it can be understood that no available inspection and testing technique or combination thereof is fully adequate to avoid corrosion due to residual water soluble flux after completion of manufacture and consequent compromise of reliability of the manufactured device.

Additionally, photo active dyes are known which, when irradiated with energy of a particular wavelength, will absorb photons at that wavelength and re-radiate photons at another lower (longer) wavelength. Such dyes are generally referred to collectively as fluorescent dyes. However, these materials also present particular difficulties for use with a water soluble solder flux.

Importantly, to be suitable for distinguishing or detecting a particular water soluble flux, the fluorescent dye must be water soluble so that it can be removed with the water soluble flux in order to provide any utility for indicating the presence of residual flux remaining after washing. Moreover, solubility of the dye must be somewhat closely matched to the water solubility of the flux so that, on the one hand, false positive inspections (as would be expected from lower dye solubility) would be very rare and, on the other hand, so that failure of detection is prevented if, for example, higher water solubility allowed the dye to be leached from the flux during washing. Most conventional fluorescent dyes are known to be insoluble or of very limited solubility in water and therefore completely unsuited for the intended application to water soluble fluxes.

Moreover, virtually all conventional fluorescent dyes are acidic while many water soluble fluxes, especially those appropriate to electronic device manufacturing are moderately basic in pH. Therefore, known fluorescent dyes are very likely to react with the materials in a water soluble solder flux and change the properties of the flux. Even if the dye is relatively inert and the reaction is slow, shelf life of the flux would be at least compromised and the likelihood of production of unreliable solder connections would increase, resulting in reduced manufacturing yield.

Further, a problem unappreciated prior to the present invention was that even certain conventional dyes considered to be substantially "inert" (i.e., non-chemically reactive with the flux) do, in fact, produce observable reactions at relatively low concentrations in water soluble solder fluxes. Reduction of concentration of fluorescent dye in a flux, however, limits the amount of energy which can be re-radiated from residual flux and would thus be expected to compromise or severely limit the ability of such a material to improve an optical inspection process.

As noted above, solder fluxes suitable for electronic devices are highly caustic while fluorescent dyes are generally acidic. Thus, even if a dye was actually inert, the mixture of an acid dye with a caustic flux will cause the mixture to become more acidic (or less alkaline) with the amount of dye added. Therefore there would be a further trade-off between compromise of the function of the flux to remove surface contamination and promote solderability and the amount of dye available for re-radiation of energy during optical testing. Further, any acidity of the dye could, itself, cause etching of metals adjacent the solder connection and compromise manufacturing yield and/or device reliability. Also, known fluorescent dyes degrade when exposed to elevated temperatures. In fact, it appears that the use of dyes in solder fluxes has been largely limited to temperature indicators as disclosed in U.S. Pat. Nos. 4,505,421, 4,563,224, 4,688,713 and 4,809,901. In these patents a dye is added to the solder flux and heat is applied until an irreversible color change of the flux is observed when the flux containing the dye reaches a critical temperature corresponding to a desired state of the solder. The dye is rendered unavailable for any future re-use.

SUMMARY OF THE INVENTION

It is therefore an object of the present invention to provide a technique of manufacturing electronic components in which even trace residual water soluble fluxes can be readily detected with predictable photo-active performance after completion of soldering operations.

It is another object of the invention to provide an electronic or other device including one or more solder connections which is completely free of residual water soluble flux used in making the solder connection.

It is a further object of the present invention to provide for optical inspection for water soluble flux which can distinguish water soluble flux from "no clean" flux.

It is yet another object of the invention to provide a water soluble flux which is optically distinct from "no clean" fluxes.

In order to accomplish these and other objects of the invention, a unique soldering flux composition is provided including a water soluble flux material and a water soluble fluorescent dye which is chemically inert to said flux material, wherein said dye is present in an amount effective to be optically detected when caused to fluoresce.

The soldering flux composition generally contains the water soluble fluorescent dye in a range amount of about 0.5% to about 5.0% by weight. The water soluble fluorescent dye preferably is selected from the group consisting of sulfonic acid salts of stilbene derivatives, fluorescein, fluoroscein salts, and rhodamine bases, and rhodamine salts. The present invention also covers a method of using the soldering flux composition in the joining of two metal surfaces with soldering. The invention also includes an electronic device free of water soluble flux which is fabricated by the inventive method.

The mixture of the water soluble fluorescent dye and a water soluble solder flux provides simple optical inspection under ultraviolet illumination with simple apparatus. The optical inspection is thus made highly sensitive to the presence of residual water soluble flux after washing and highly specific to the water soluble flux with which the dye is mixed. Thus, optical inspection can assure that all water soluble flux is removed to avoid subsequent corrosion while providing the possibility of leaving so-called "no clean" fluxes in place.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
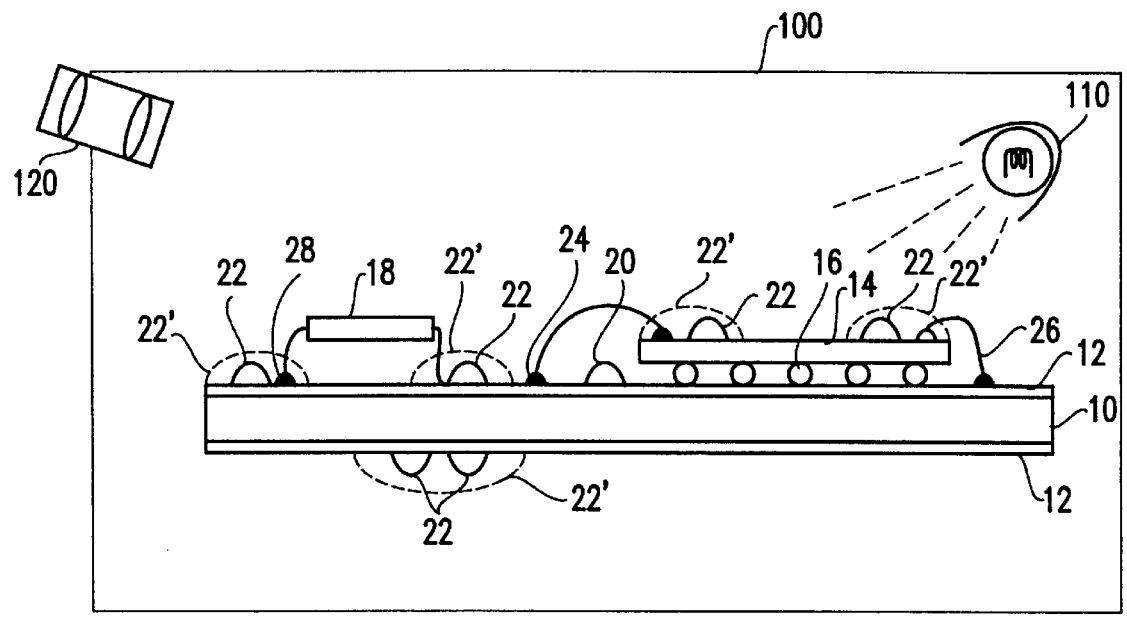
FIG. 1 is a diagram illustrating optical inspection of a simple electronic device.

Referring now to the drawings, and more particularly to FIG. 1, there is shown a side view of a simple electronic device comprising substrate 10 having patterned metallization 12 (for purposes of illustration) on both sides thereof. A chip 14 and a discrete component 18 (e.g. a resistor or capacitor) are depicted as mounted thereon by solder joints. In the manufacture of this device, the mounting and connection requirements of the chip, jumper connections 26 and the discrete component 18 are very different and the soldering processes would probably be carried out at different times and with different materials.

For purposes of this example, it is assumed that discrete component 18 is mounted using a high temperature solder 28 and a water soluble flux and that solder connections 16 are formed by so-called C4 preforms at a low temperature and a "no clean" flux which can be included therein. Solder alloys having different melting points would be used depending on the order in which connections 28 and 16 are made with the higher temperature melting point alloy used for earlier processes. For this reason, chips are usually installed at later steps to allow exposure only to lower temperatures. Residual "no clean" flux from this latter operation is depicted by reference numeral 20.

It is further assumed that jumpers 26 are then connected using a lower melting point solder alloy 24 (to accommodate the heat budget of the chip and to avoid softening of connections 16) than the C4 preforms and a water soluble flux. Residual water soluble flux from mounting of discrete components 18 and jumpers 26 thus form deposits such as 22' (depicted by dashed lines) which are assumed, for purposes of this description, to be less than fully removed by washing, leaving deposits 22 which would later cause corrosion of metallization 12.

While the use of dyes and/or stains to impart visual distinctness to different materials is known in many fields, to the knowledge of the present inventors, use of dyes has not been used to distinguish solder fluxes or to allow detection of residual water soluble flux, particularly in the presence of "no clean" flux. The present invention successfully applies dyes or stains to water soluble solder fluxes to distinguish solder fluxes or to allow detection of residual water soluble flux.

Solder fluxes tend to be of a relatively dark hue, particularly after heating. Therefore, the amount of optical distinctness which could be obtained with a stain is very limited. This fact, coupled with a need to differentially detect very small quantities of flux within a potentially complex topography virtually eliminates any utility for use of stains or other light absorbent materials to improve optical inspection in optical inspection systems such as is schematically indicated in FIG. 1 by light box 100, light source 110 and optical inspection system 120, even when highly sophisticated arrangements are employed.

The inventors have discovered that the above enumerated objectives can be satisfied by use of water soluble fluorescent dye materials functionalized with one or more types of polar groups that engender solubility without significantly effecting the acid number of the flux, and which are water soluble and relatively non-reactive when mixed with a caustic material. The water soluble fluorescent dye also is properly selected and the soldering conditions appropriately managed so that the water soluble fluorescent dye does not degrade in the temperature-time cycle associated with the particular soldering operation. In this regard, the water soluble fluorescent dye materials must be able to tolerate not only the soldering temperature, which typically can be up to about 200° C., without degrading, but also must tolerate the heat for the duration of the soldering procedure. Most organics are affected at 200° C. with prolonged heating. Typical soldering time cycles can run about 30 seconds to about five minutes. For example, one of the exemplary dye compounds disclosed herein, viz., Scanning Compound 38, when used at 1.5 wt. % in Kester 450B type flux, has been observed to fluoresce up until the soldering time period reached five minutes, and beyond this period decomposition of the flux becomes severe. Therefore, the suitable combinations of soldering temperatures and durations for a given water soluble fluoresecent dye can be empirically determined in the practice of this invention.

These water soluble fluorescent dye materials include, for example, sulfonated stilbene derivatives, fluoroscein compounds, and rhodamine compounds, and their respective water soluble salts.

Exemplary water soluble fluorescent dye materials based on sulfonated stilbene derivatives that are useful in the practice of this invention include:

Scanning Compound 38, a sulfonated stilbene complex having a fluorescent wavelength range of 400–470 nm (blue range), and it is commercially available from Angstrom Technologies, 1895 Airport Exchange Blvd, #110, Erlanger, Ky. 41018; and Fluorescent Brightener 28 (CAS# 4404-47-7, C.I. 40622), a sulfonated stilbene complex emitting at 400–470 nm (blue range), and it is commercially available as a yellow, water-soluble powder from Aldrich Chemical Co.

The generic chemical structure of Fluorescent Brightener 28 has been represented in the literature by Formula I hereafter:

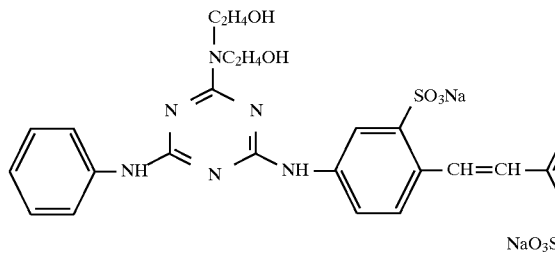

Formula I has a generic name of bis{anilino[(diethoxy)aminotriazyl]amino}-stilbenedisulfonate.

Scanning Compound 38 and Fluorescent Brightener 28 are thought to be chemical analogs of each other based on comparisons of IR and NMR spectra analyses performed on these compounds.

In addition to the sulfonic acid salts of stilbene mentioned above, examples of other types of suitable water soluble fluorescent dyes for practicing this invention include the following:

Solvent Yellow 94 or "Fluorescein" (CAS# 2321-07-5, C.I. 45350.1), emitting at 510–570 nm (yellow-green range), Merck Index (12th ed.) monograph #4194, and having the following structure represented by Formula II:

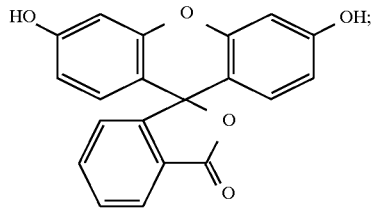

Acid Yellow 73, or "Fluorescein Disodium Salt" (CAS#518-47-8, C.I. 45350), emitting at 510–570 nm (yellow-green range), Merck Index (12th ed.) monograph #4194;

Rhodamine W. T., having a fluorescent wavelength range of 580–620 nm (purple-red range), and it is commercially available from Formulabs, Inc., P. O. Box 1869, Piqua, Ohio 45356;

Rhodamine B, also known as basic violet 10 (CAS# 81-88-9, C.I. 45170) emitting at 580–620 nm (purple-red range), Merck Index (12th ed.) monograph #8349, and having the following structure represented by Formula III:

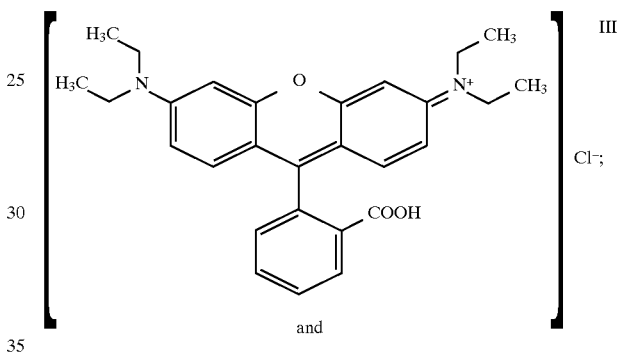

Rhodamine B base, also known as Solvent Red 49 (CAS# 509-34-2, C.I. 45170.1), emitting at 580–620 nm (purple-red range).

The water soluble fluorescent dye materials, such as described above, can be used alone or combinations thereof. For instance, the water soluble fluorescein and/or rhodamine dyes, which fluoresce at different wavelengths (viz., longer wavelengths), than the water soluble stilbene derivatives, can be used in combination with the water soluble stilbene derivatives in order to expand or tailor the range of wavelengths for detection of residual flux in a soldered and washed printed circuit board.

Further, the above described types of water soluble fluorescent dye materials display sufficient photo-activity to support highly effective optical inspection at very low concentrations in flux below levels where any chemical reaction or compromise of flux properties is observable. Water solubility sufficiently approximates that of the solder flux that false positives and leaching beyond the point of successful testing is extremely rare.

More generally, while any fluorescent dyes functionalized with polar groups as described above could theoretically be used in the practice of the invention, the dyes, and particularly, the stilbene derivatives functionalized with polar groups, will vary widely in potential acidity. For this reason, sulfonic acid salts of stilbene are most preferred for practice of the invention since they exhibit lowest potential acidity, although the invention may be successfully practiced with other stilbene derivatives such as phosphate salts. On the other hand, highly acidic stilbene derivatives, such as those having carboxyl-functionalization, would be only marginally usable, if at all, unless potential acidic polar groups were balanced with basic polar groups, as in the case of Rhodamine B. Beyond the aspect of potential acidity, the choice of stilbene derivatives is relatively non-critical to the practice of the invention. Combinations of stilbene derivatives of different effective solubilities can also be used and potentially distinguished by wavelength of re-radiated emissions to yield additional functionalities such as extrapolating the wash time for full clearing of water soluble flux or tagging particular fluxes utilizing the invention.

For convenience, it is preferred to practice the invention with Scanning Compound 38, Fluorescent Brightener 28, and Rhodamine W.T., singly or in any combination thereof.

The particular type of solder used in the practice of this invention is not particularly limited. The particular flux used will depend on the nature of the solder in a given application. For example, the solder flux can be based on natural rosin, or can be based on inorganic or organic acids. Optimum mixture concentrations for practice of the invention vary with the particular flux in use and particular water soluble fluorescent dye or combination thereof, which may be chosen. The dye is incorporated into a solder flux composition by known techniques. Tests of flux mixtures including water soluble fluorescent dyes for water solubility, solderability, shelf life and acid number from commercially available UV-fluorescent tubes generally show that the invention may be adequately practiced with concentrations of the water soluble fluorescent dye generally between about 0.5% and about 5.0%, more preferably between about 1.0% to about 2.0%, by weight, of the total flux composition. The above general range concentration is less than one-third of the concentration at which reactions of the dye and flux could be observed providing relatively wide margins for practice of the invention with various water soluble fluorescent dye compositions while avoiding compromise of flux properties.

In testing performed on three different types of commercially available water soluble fluxes, viz., Alpha 870-25 flux (pH=8), Kester 450B flux (pH=6, acid number=10), and Kester 2222 flux (pH=1.2, acid number=52), using each of Rhodamine B and Fluorescein Disodium salt (Acid Yellow 73), the solubility of each of the fluorescent dyes itself in water, as well as the water solubility, solderability, shelf life and acid number for each flux and dye mixture composition were examined. The results indicated an optimal dye concentration of about 1.0% by weight of the fluorescent dye for the Alpha 870-25 flux, and about 1.5% by weight dye concentration for the Kester 450B flux or Kester 2222 flux. These flux mixtures have exhibited stable shelf lifes as well. Acid number, also referred to as "acid value", is determined by the number of milligrams of potassium hydroxide required for the neutralization of free acids present in a substance.

In general, somewhat greater amounts of water soluble fluorescent dye, within the above working limits, should be used with lower water solubility of the flux for a given solubility/volatility of the dye to compensate for dye leaching while maintaining sufficient luminosity for optical inspection. Somewhat greater amounts of water soluble fluorescent dye may be tolerable in more caustic fluxes. The water soluble fluorescent dyes, as combined with flux materials, still fluoresce even after extended periods of storage time, so even if a dye salt is formed it remains water soluble.

Also, the water soluble fluorescent dye materials can optionally be used in conjunction with other fluorescent dye materials that are non-water soluble materials to the extent that another type of additive can be included in the flux to solubilize the non-water soluble dye material and if other general conditions are met as described below. This flux would then be removed by a water rinse if the additive is water soluble or water miscible, and still solubilizes the dye. For example, Scanning Compound 7 is a UV flourescent material that is non-water soluble but it is alcohol (e.g., methanol) soluble. Thus, a conceivable example of a mixture of a water soluble fluorescent dye as used per the present invention with a non-water soluble dye, could involve a flux, such as Kester 450-B containing both an amount of water soluble Scanning 38 as well as a percentage of an alcohol for solubilizing a non-water soluble dye ingredient such as Scanning Compound 7 into the flux formulation. Alternatively, a flux could contain a mixture of the non-water soluble dye and the water soluble fluorescent dye if the flux can be removed after soldering with a mixture containing water with another solvent for the non-water soluble dye. The flux could be water soluble or non-water soluble, and the cleaner would change accordingly. However, the non-water soluble dye, if present in the flux, cannot be a dye compound having acidic groups or other substituents which are likely to react with basic mixtures, such as Scanning Compound 38, or vice versa, causing either precipitation of a salt complex from the flux or actual destruction of the water soluble fluorescent dye with a loss of fluorescence. The operable range of flux concentrations can be adjusted for such other different dye materials, which may also be found suitable as long as the concentration is kept below about one-half, preferably about one-third, of the concentration at which such reactions occur or other compromise of flux performance can be observed.

The flux composition can also contain adjuvants to the extent they do not interfere with the function of the dye or solder, including, for example, pH buffers, stabilizers, and dispersing aids such as water, alcohol, and/or a surfactant.

Figure 2:
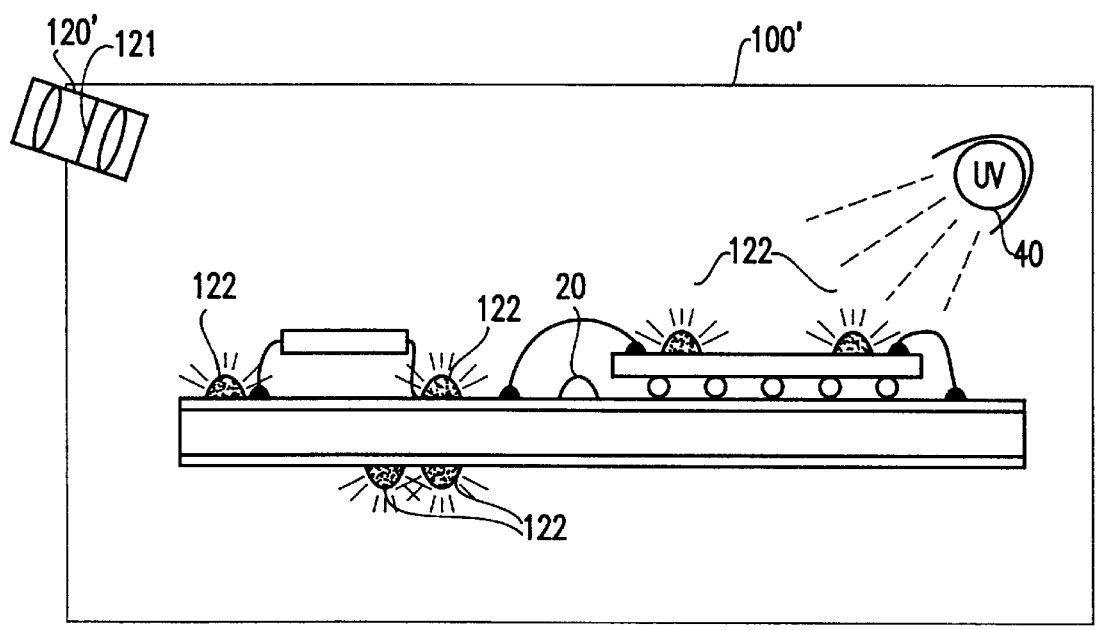
FIG. 2 is a diagram illustrating optical inspection of a similar simple electronic device employing the invention.

In practice, as shown in FIG. 2, the water soluble fluorescent dye is added to water soluble flux during construction of an electronic device in the manner described above in regard to FIG. 1, and, after washing, the device may be placed in a simple light box 100' to exclude at least a major portion of ambient light. Ultraviolet light may be provided from a simple and inexpensive source 140 (details of which are not at all critical to the practice of the invention), such as a UV fluorescent tube. Residual water soluble flux deposits 122 remaining after washing, if any, fluoresce with sufficient brightness to be seen by the unaided eye although magnification and automated optical inspection could also be used, as generally indicated at 120'. Image intensification, such as with a Channel Electron Multiplier, schematically indicated at 121, is not considered necessary in either case but could be used for critical inspections at higher sensitivity if desired.

In view of the foregoing, it is seen that the invention provides a solder flux containing a fluorescent dye which is of similar water solubility (or a combination of solubility and volatility) to the flux provides optical distinction between "no clean" fluxes and water soluble fluxes and allows simple optical inspection with very simple apparatus to confirm complete removal of water soluble fluxes by washing processes. If any water soluble flux is found to remain upon optical inspection in accordance with the invention, a further washing process can be applied and repeated as necessary until no further water soluble flux is detected. Thus a source of corrosion and a failure mode of devices fabricated using water soluble solder fluxes has been eliminated by use of the invention. Use of the flux and inspection in accordance with the invention provides increased manufacturing yields and reliability of manufactured devices.

While the invention has been described in terms of a single preferred embodiment, those skilled in the art will recognize that the invention can be practiced with modification within the spirit and scope of the appended claims.

Having thus described my invention, what we claim as new and desire to secure by letters patent is as follows:

1. A method of joining two metal surfaces including the steps of:

mixing a water soluble fluorescent dye with a water soluble soldering flux to form a soldering flux mixture;

heating said metal surfaces, a solder material and said soldering flux mixture to a soldering temperature at or above a softening temperature of said solder material and for a time period to form a solder connection, wherein said water soluble fluorescent dye does not degrade at said soldering temperature and time period;

washing said solder connection with water to cause removal of said water soluble fluorescent dye and said water soluble soldering flux from said solder connection; and inspecting said solder connection under illumination at an wavelength effective to cause any of said water soluble fluorescent dye that still may be present in said solder connection to fluoresce to provide detection of any residual water soluble flux remaining in said solder connection after said washing step.

2. The method of claim 1, wherein said water soluble fluorescent dye is contained in said soldering flux composition in a range amount of about 0.5% to about 5.0% by weight.

3. The method of claim 1, wherein said water soluble fluorescent dye is selected from the group consisting of sulfonic acid salts of stilbene derivatives, fluorescein, fluoroscein salts, and rhodamine bases, and rhodamine salts.

4. The method of claim 1, wherein said flux material is selected from the group consisting of material based on natural rosin, material based on inorganic acids, material based on organic acids.

5. The method of claim 1, further comprising repeating said washing step and said inspecting step when fluorescent dye is detected during said inspecting step until the presence of fluorescent dye is no longer detected in the solder connection.

6. The method of claim 1, wherein said inspecting comprises an optical inspection and said illumination comprises ultraviolet illumination.

7. The method of claim 1, wherein said water soluble fluorescent dye is contained in said soldering flux composition in a range amount of about 1.0% to about 2.0% by weight.

8. The method of claim 1, wherein said fluorescent dye comprises a water soluble dye material functionalized with one or more polar groups that increase water solubility of said dye without significantly effecting the acid number of said flux.

9. The method of claim 1, wherein said dye is substantially non-chemically reactive with caustic materials.

* * * * *